(12) United States Patent
Takeuchi

(10) Patent No.: US 7,242,616 B2
(45) Date of Patent: Jul. 10, 2007

(54) NON-VOLATILE SEMICONDUCTOR MEMORY DEVICE

(75) Inventor: Ken Takeuchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 33 days.

(21) Appl. No.: 11/321,865

(22) Filed: Dec. 30, 2005

(65) Prior Publication Data

US 2006/0171235 A1     Aug. 3, 2006

(30) Foreign Application Priority Data

Jan. 13, 2005   (JP)   ............................ 2005-006766

(51) Int. Cl.
*G11C 16/04* (2006.01)
(52) U.S. Cl. ................................ 365/185.17; 365/185.3
(58) Field of Classification Search ........... 365/185.17, 365/185.3, 230.03
See application file for complete search history.

(56) References Cited

U.S. PATENT DOCUMENTS

| | | | |
|---|---|---|---|
| 5,781,478 A | 7/1998 | Takeuchi et al. | |
| 5,920,507 A | 7/1999 | Takeuchi et al. | |
| 5,986,933 A * | 11/1999 | Takeuchi et al. | ........ 365/185.12 |
| 6,069,823 A | 5/2000 | Takeuchi et al. | |
| 6,147,911 A | 11/2000 | Takeuchi et al. | |
| 6,307,785 B1 | 10/2001 | Takeuchi et al. | |
| 6,373,746 B1 * | 4/2002 | Takeuchi et al. | ........ 365/185.03 |
| 6,490,210 B2 * | 12/2002 | Takase et al. | ............... 365/201 |

* cited by examiner

*Primary Examiner*—Vu A. Le
(74) *Attorney, Agent, or Firm*—Oblon, Spivak, McClelland, Maier & Neustadt, P.C.

(57) ABSTRACT

A non-volatile semiconductor memory device comprises a semiconductor substrate; a cell well formed in the semiconductor substrate; a first sub cell array including part of a cell array of NAND cells arranged in array in the cell well; a second sub cell array including the remainder of the cell array and arranged in the same cell well as that for the first sub cell array; a first sense amp corresponding to the first sub cell array; a second sense amp corresponding to the second sub cell array; a first bit line group including one of portions of a bit line group divided on the way extending from the first sense amp to the second sense amp and corresponding to the first sub cell array; and a second bit line group including the other of the portions of the bit line group divided on the way and corresponding to the second sub cell array.

11 Claims, 19 Drawing Sheets

NON-VOLATILE SEMICONDUCTOR MEMORY DEVICE

CROSS-REFERENCE TO RELATED APPLICATION

This application is based upon and claims the benefit of priority from the prior Japanese Patent Application No. 2005-006766, filed on Jan. 13, 2005; the entire contents of which are incorporated herein by reference.

BACKGROUND OF THE INVENTION

1. Field of the Invention

The present invention relates to an electrically data-rewritable non-volatile semiconductor memory device such as a NAND-type EEPROM.

2. Description of the Related Art

An EEPROM has been known in the art as electrically erasable programmable one of semiconductor memories. Among those, a NAND-type EEPROM, comprising NAND cells, each including a plurality of serially connected memory cells, each serving as the unit of one bit storage, has received attention because it can be highly integrated. The NAND-type may be utilized in a memory card to store image data output from a digital still camera, for example.

A memory cell in the NAND-type EEPROM has an FET-MOS structure that includes a floating gate and a word line stacked, with interposition of insulator films, on a semiconductor substrate that serves as a channel region. A NAND cell includes a plurality of serially connected memory cells in such a manner that adjacent ones share a source/drain (see JP-A 2002-313089, FIG. 32, for example). The source/drain is an impurity region that serves as at least one of a source and a drain.

BRIEF SUMMARY OF THE INVENTION

According to an aspect of the present invention, there is provided a non-volatile semiconductor memory device comprises a semiconductor substrate; a cell well formed in the semiconductor substrate; a first sub cell array including part of a cell array of NAND cells arranged in array in the cell well; a second sub cell array including the remainder of the cell array and arranged in the same cell well as that for the first sub cell array; a first sense amp corresponding to the first sub cell array; a second sense amp corresponding to the second sub cell array; a first bit line group including one of portions of a bit line group divided on the way extending from the first sense amp to the second sense amp and corresponding to the first sub cell array; and a second bit line group including the other of the portions of the bit line group divided on the way and corresponding to the second sub cell array.

DETAILED DESCRIPTION OF THE INVENTION

Figure 1:
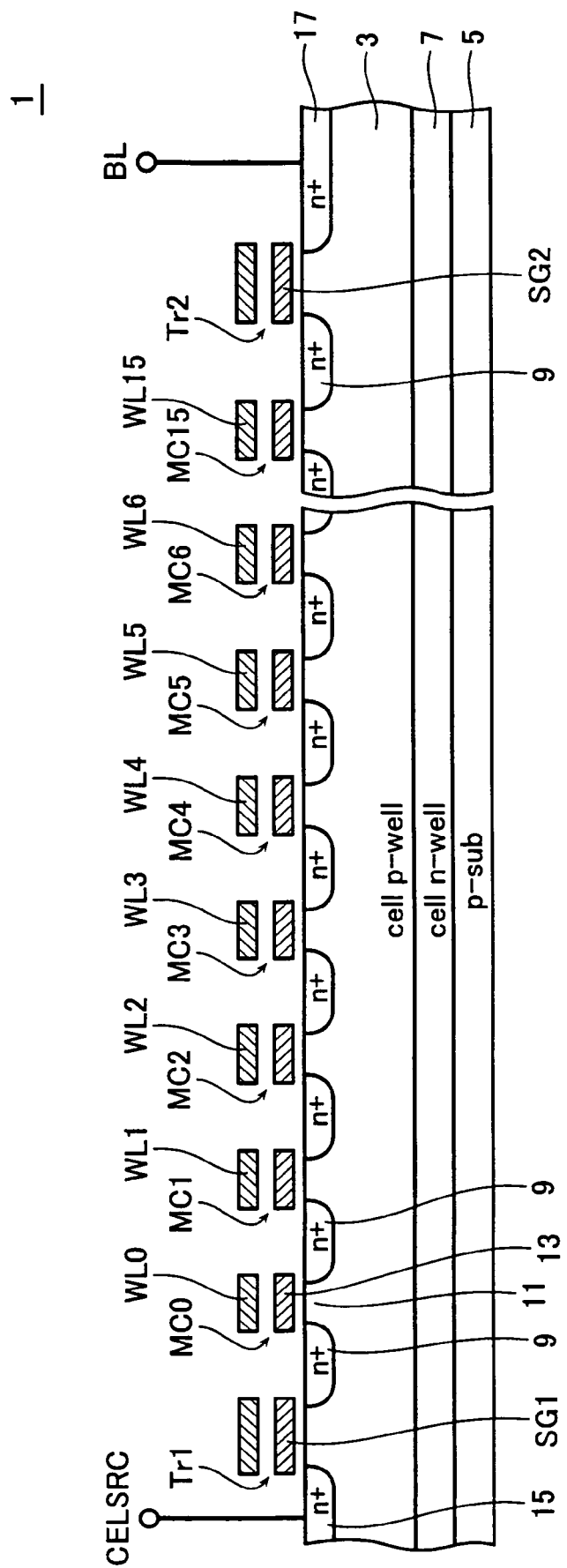
FIG. 1 is a cross-sectional schematic diagram of a NAND cell contained in a NAND-type EEPROM according to the embodiment.

The embodiment of the present invention will now be described about the following classified items.

[Description of NAND Cell According to the Embodiment]
  {Structure of NAND cell}
  {Operations of NAND cell}
  (Writing)
  (Erasing)
  (Reading)

[Description of NAND-Type EEPROM According to the Embodiment]
  {Structure of NAND-type EEPROM}

{Primary characteristics of the embodiment}
  (First characteristic)
  (Second characteristic)
  (Third characteristic)
[Modifications]
  {First modification}
  {Second modification}

The parts same as or similar to those denoted with the reference numerals already described in the figures are given the same reference numerals to omit duplicated descriptions thereof.

[Description of NAND Cell According to the Embodiment]

{Structure of NAND Cell}

Figure 2:
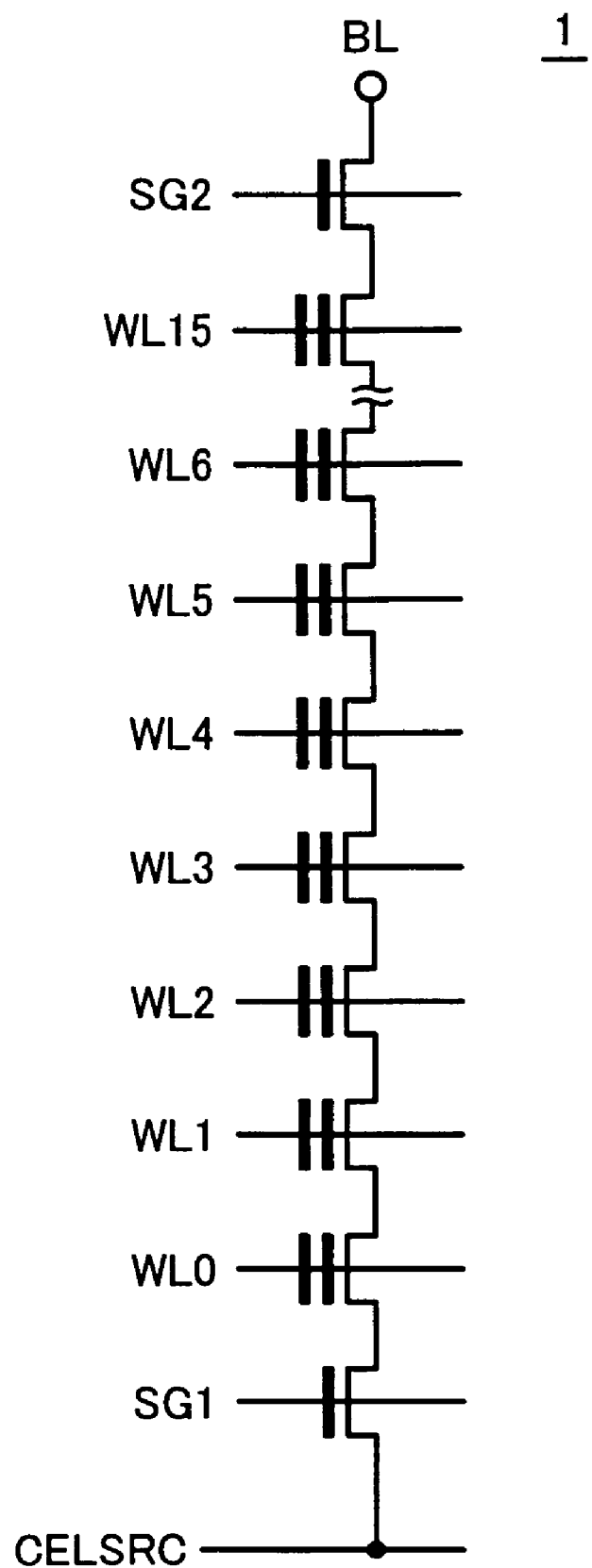
FIG. 2 is an equivalent circuit diagram of the NAND cell of FIG. 1.

FIG. 1 is a cross-sectional schematic diagram of a NAND cell contained in a NAND-type EEPROM according to the embodiment. FIG. 2 is an equivalent circuit diagram of the NAND cell of FIG. 1. The NAND cell 1 is configured in a p-type cell well 3 as shown in FIGS. 1 and 2 such that a selection transistor Tr1, 16 memory cells MC0-15 and a selection transistor Tr2 are serially connected. The p-type cell well 3 is formed in an n-type cell well 7 on a p⁻-type semiconductor substrate 5. This cell well is a double-well of the p-type cell well 3 and the n-type cell well 7.

The memory cell is an electrically data-rewritable non-volatile cell. Each memory cell has the same configuration. For example, the memory cell MC0 comprises a pair of n⁺-type impurity regions 9 (source/drain) formed at a certain interval on the upper surface of the p-type cell well 3. A channel region 11 is located in the p-type cell well 3 between the impurity regions 9. A floating gate 13 is formed on the channel region 11 with interposition of a gate insulator, not shown. A word line WL0 is formed on the floating gate 13 with interposition of an insulator, not shown.

In the NAND cell 1, the 16 memory cells are serially connected in such a manner that adjacent ones share a source/drain. The number of memory cells that configure the NAND cell 1 is equal to 16 in the described example though it may be equal to 8, 32 or 64.

The selection transistors Tr1 and Tr2 are arranged at both ends of the serially connected 16 memory cells. In a detailed description, the selection transistor Tr1 having a selection gate line SG1 is formed at the memory cell MC0 side. A current path in the selection transistor Tr1 has one end connected through the impurity region 9 to one end of a current path in the memory cell MC0. The other end of the current path in the selection transistor Tr1, or an n⁺-type impurity region 15 formed in the cell well 3, is connected to a source line CELSRC. The selection transistor Tr1 is operative to control connection and disconnection between the memory cell and the source line CELSRC.

On the other hand, the selection transistor Tr2 having a selection gate line SG2 is formed at the memory cell MC15 side. A current path in the selection transistor Tr2 has one end connected through the impurity region 9 to one end of a current path in the memory cell MC15. The other end of the current path in the selection transistor Tr2, or an n⁺-type impurity region 17 formed in the cell well 3, is connected to a bit line BL. The selection transistor Tr2 is operative to control connection and disconnection between the memory cell and the bit line BL.

{Operations of NAND Cell}

(Writing)

Figure 3:
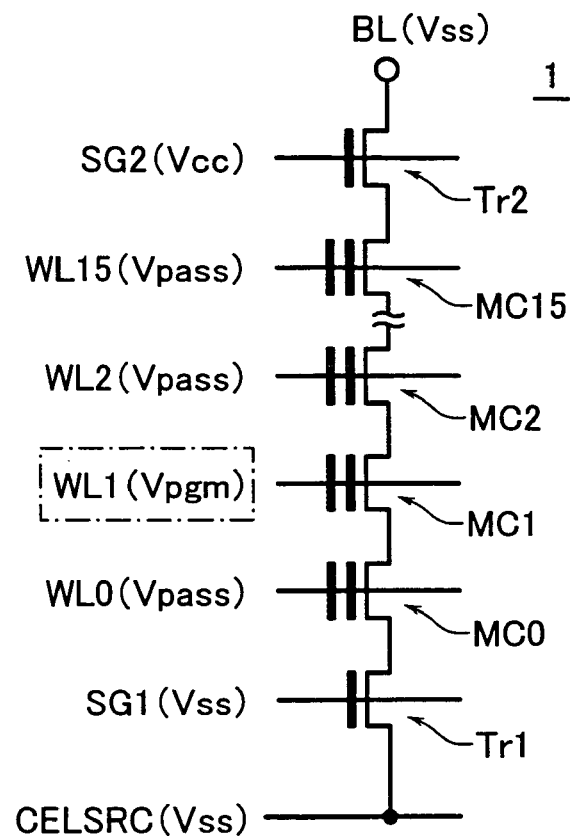
FIG. 3 is an equivalent circuit diagram of the NAND cell that contains a memory cell for "0" write in an example of writing in the NAND cell.
Figure 4:
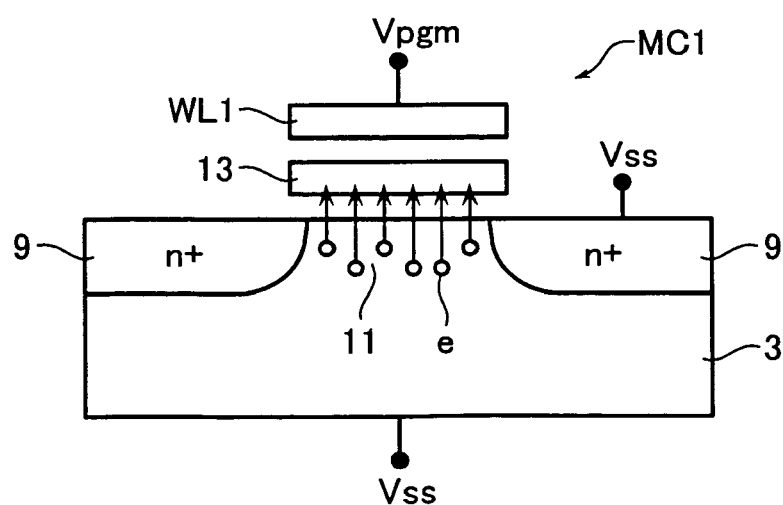
FIG. 4 is a schematic diagram of the memory cell for "0" write of FIG. 3.
Figure 5:
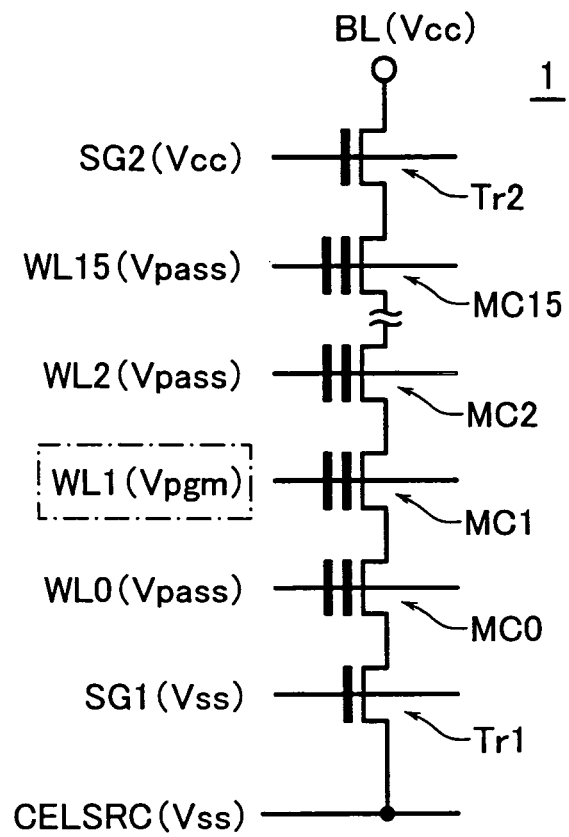
FIG. 5 is an equivalent circuit diagram of the NAND cell that contains a memory cell for "1" write in an example of writing in the NAND cell.
Figure 6:
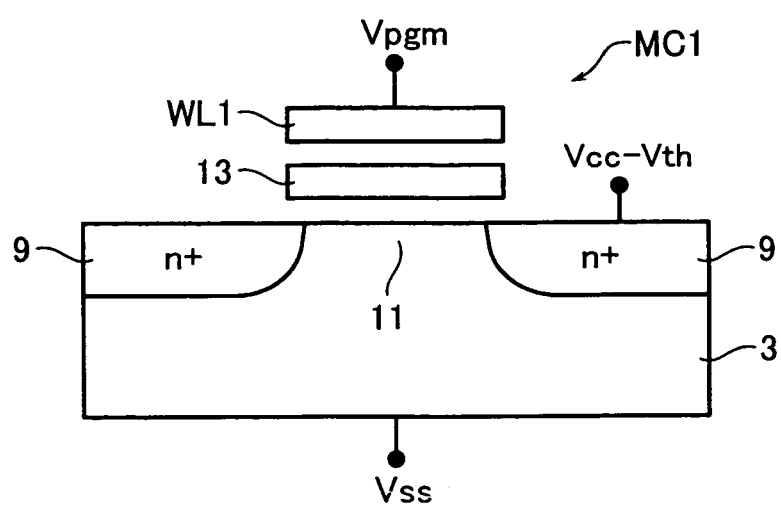
FIG. 6 is a schematic diagram of the memory cell for "1" write of FIG. 5.

Data writing is described with reference to FIGS. 3-6. FIG. 3 is an equivalent circuit diagram of the NAND cell 1 that contains a memory cell for "0" write, and FIG. 5 is the same for "1" write. The NAND cell 1 in FIGS. 3 and 5 includes 16 memory cells. FIG. 4 is a schematic diagram of the memory cell for "0" write, and FIG. 6 is the same for "1" write.

Writing is executed after the NAND cell 1 is erased, or each memory cell in the NAND cell 1 is controlled to have a threshold shifted to a negative voltage. Writing is performed in turn from the memory cell MC0 at the source line CELSRC side. An example of writing in the memory cell MC1 is described.

First, for "0" write, Vcc (supply voltage) is applied to the selection gate line SG2 to turn on the selection transistor Tr2 as shown in FIGS. 3 and 4. In addition, the voltage on the bit line BL is set at Vss (ground voltage: 0 V). In this case, as the voltage on the selection gate line SG1 is Vss, the selection transistor Tr1 is kept off.

Then, a high voltage Vpgm (about 20 V) is applied to the word line WL1 of the memory cell MC1, and a middle voltage Vpass (about 10 V) is applied to other word lines. In this case, as the voltage on the bit line BL is 0 V, the voltage can be transferred to the channel region 11 in the memory cell MC1. Thus, the voltage at the channel region 11 can be kept at 0 V.

In this case, as the potential between the word line WL1 and the channel region 11 is large, electrons "e" due to tunnel current are injected into the floating gate 13 in the memory cell MC1. As a result, the threshold of the memory cell MC1 is shifted to a positive state ("0"-written state).

On the other hand, as for "1" write, the difference from the "0" write is mainly described with reference to FIGS. 5 and 6. First, Vcc is applied to the bit line BL. In this case, Vcc is applied to the selection gate line SG2. Accordingly, when the voltage at the channel region 11 reaches Vcc minus Vth (Vcc−Vth: where Vth denotes the threshold of the selection transistor Tr2), the selection transistor Tr2 is cut off. Therefore, the channel region 11 is floated at a voltage of Vcc−Vth.

Then, the high voltage Vpgm (20 V) is applied to the word line WL1, and the middle voltage Vpass (10 V) is applied to other word lines. As a result, capacitive coupling between each word line and the channel region 11 boosts the voltage at the channel region 11 from Vcc−Vth to about 8 V, for example.

As the voltage at the channel region 11 is boosted to a high voltage, different from the "0" write, the potential between the word line WL1 and the channel region 11 is small. Therefore, the electron injection due to tunnel current is not caused to the floating gate 13 in the memory cell MC1. As a result, the threshold of the memory cell MC1 is kept at a negative state ("1"-written state).

In this case, batch writing (for example, simultaneous writing data of 256 bytes) in memory cells commonly connected to one word line is performed to achieve high-speed writing.

(Erasing)

Figure 7:
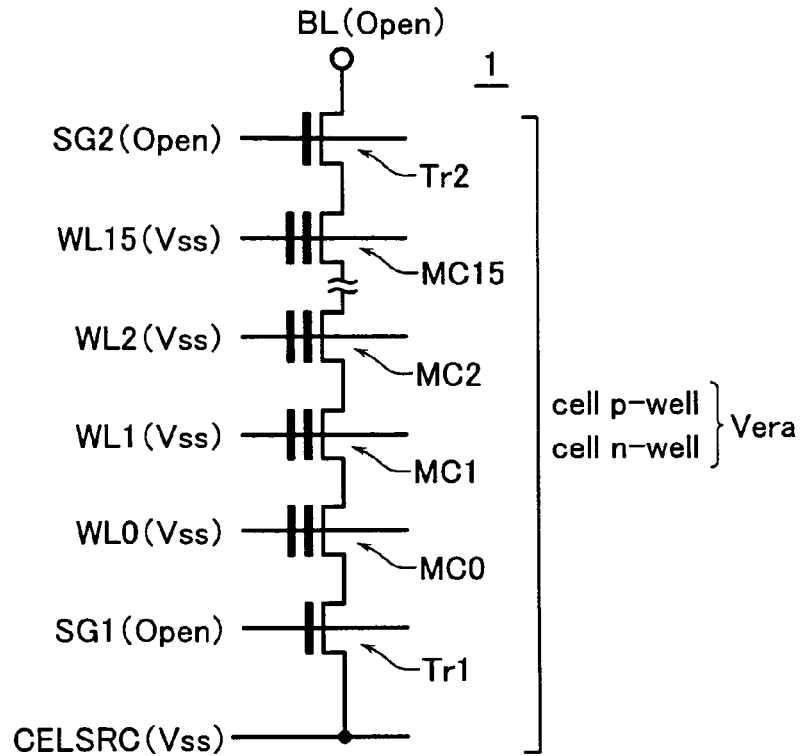
FIG. 7 is an equivalent circuit diagram of the NAND cell that contains a memory cell for data erase in an example of erasing in the NAND cell.

FIG. 7 is an equivalent circuit diagram of the NAND cell for data erase. On erasing, the voltages on the word lines WL0-WL15 are set at Vss (ground voltage: 0 V). On the other hand, the bit line BL is made floated. In addition, the selection gate lines SG1 and SG2 are set at an initial voltage Va (such as Vcc) and then made floated. A high voltage Vera (about 20 V) is applied to the p- and n-type cell wells 3 and 7 (FIG. 1). Thus, tunnel current acts to release the electrons from inside the floating gate into the p-type cell well 3 in the memory cells MC0-MC15. As a result, the thresholds of these memory cells are shifted negative. The data erase is performed by batch erasing on the basis of a block composed of a plurality of NAND cells 1. The detail of the block is described later.

(Reading)

Figure 8:
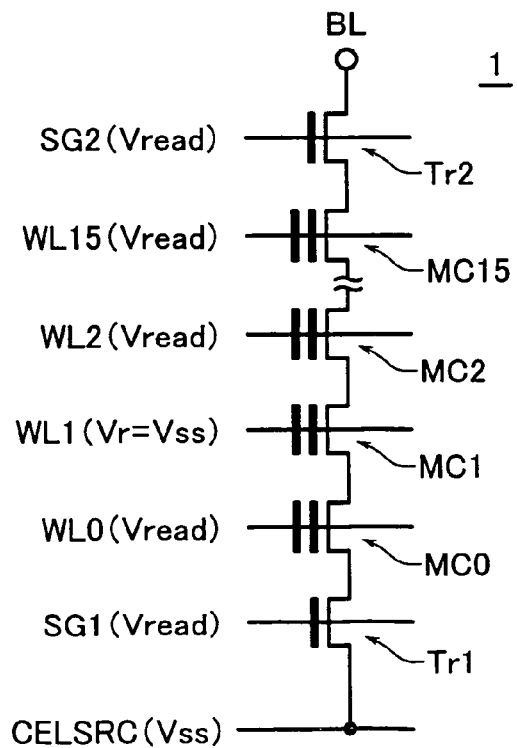
FIG. 8 is an equivalent circuit diagram of the NAND cell that contains a memory cell for data read in an example of reading in the NAND cell.
Figure 9:
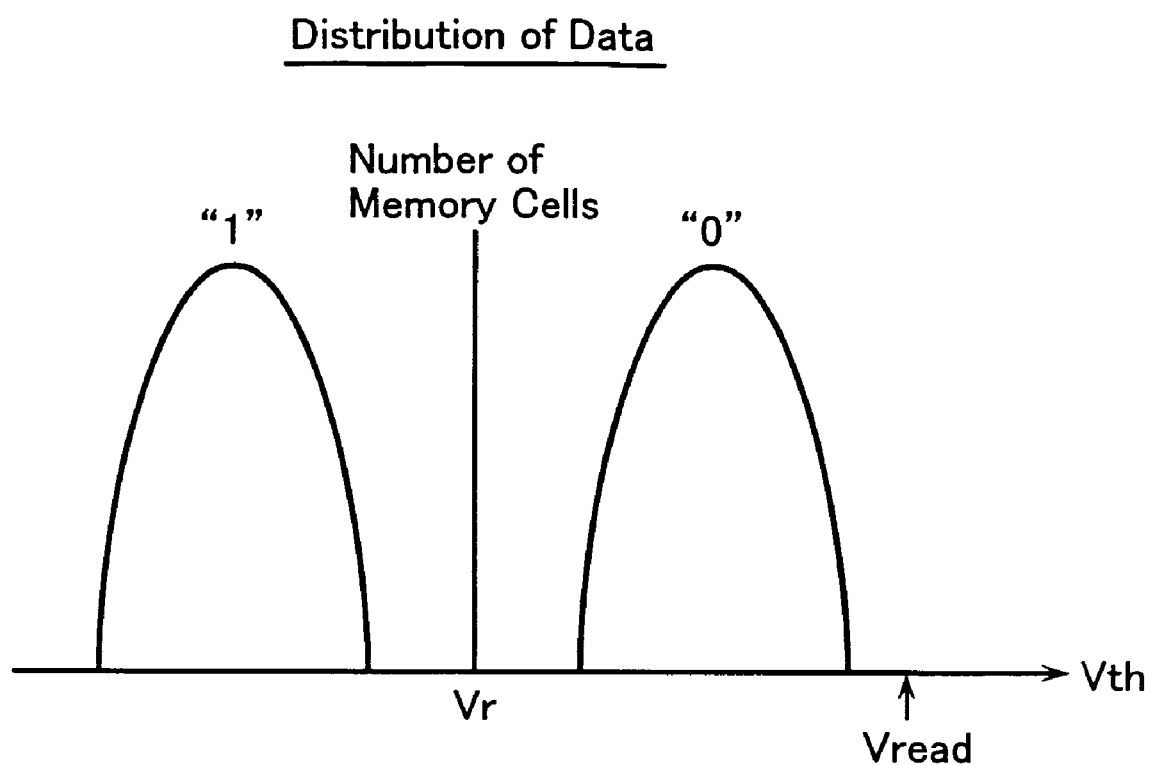
FIG. 9 is a graph showing a distribution of data "0" and "1"

FIG. 8 is an equivalent circuit diagram of the NAND cell 1 that contains a memory cell for data read. FIG. 9 is a graph showing a distribution of data "0" and "1" with the lateral axis indicative of the threshold voltage and the vertical axis indicative of the number of memory cells. On reading, the voltage on the word line WL1 associated with the memory cell MC1 selected for reading is set at a voltage Vr (such as Vss: 0 V). In addition, a reading middle voltage Vread slightly higher than the supply voltage is applied to the word lines WL0, 2-15 and the selection gate lines SG1, 2 associated with non-selected memory cells to detect if current flows in the memory cell MC1 selected for reading. If the data stored in the memory cell MC1 is "0", the bit line BL can not discharge because the memory cell MC1 is turned off. If it is "1" on the other hand, the bit line BL can discharge because the memory cell MC1 is turned on.

[Description of NAND-type EEPROM According to the Embodiment]

{Structure of NAND-type EEPROM}

Figure 10:
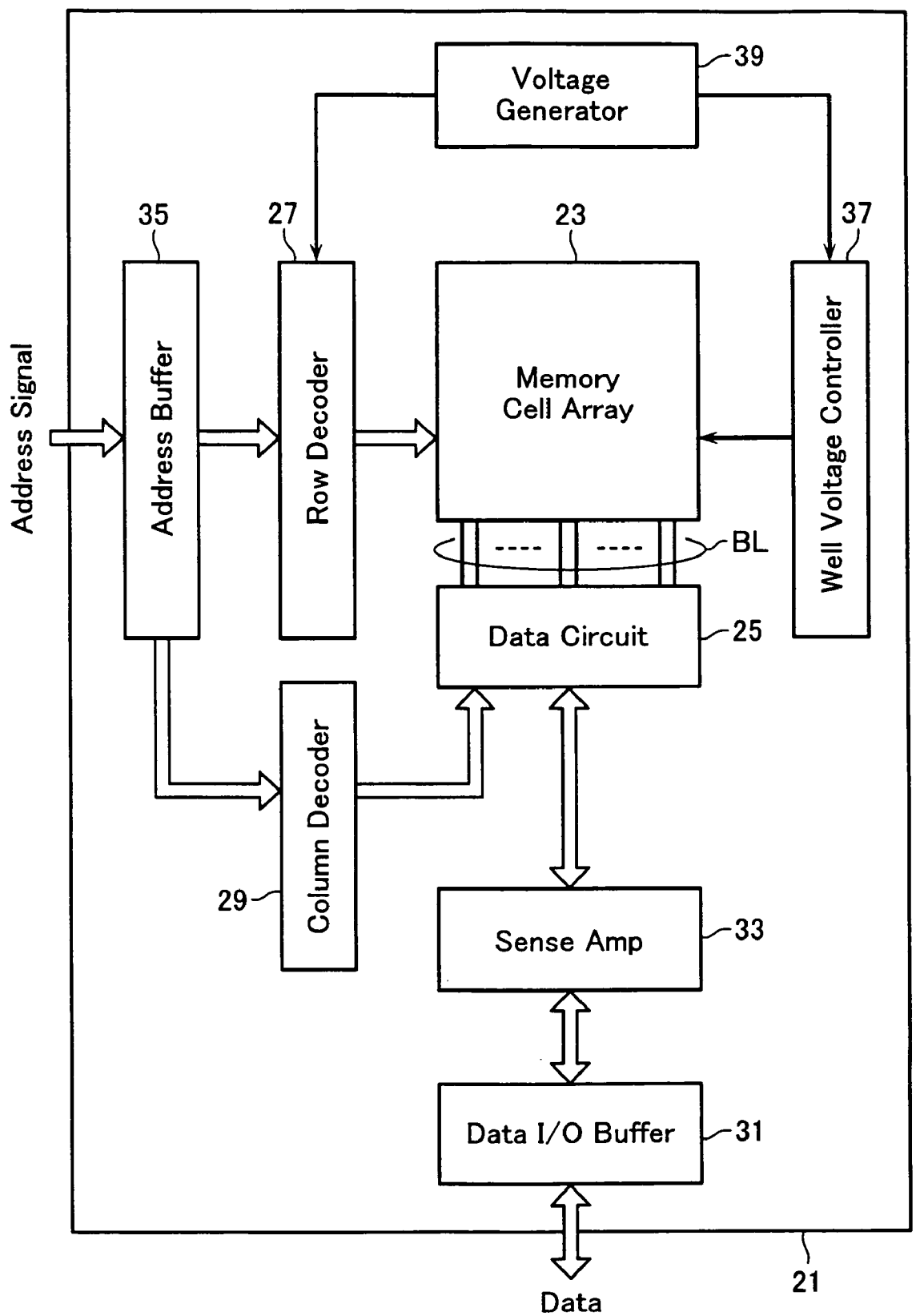
FIG. 10 is a block diagram of the whole arrangement in a NAND-type EEPROM chip according to the embodiment.

FIG. 10 is a block diagram of the whole arrangement in a NAND-type EEPROM chip 21 according to the embodiment. Circuit blocks which constitute NAND-type EEPROM are described below. A memory cell array 23 is structured to include the NAND cells 1 of FIG. 2 arranged in array. A data circuit 25 includes latches employed to temporarily store data to be written in memory cells on writing and data read from memory cells on reading. A row decoder 27 is operative to control selection of the word lines and the selection gate lines arranged in the memory cell array 23.

A column decoder 29 is operative to select a column in the memory cell array 23 based on a column address signal. On writing, input data is provided via a data I/O buffer 31 and a sense amp 33 to the latch belonging to the selected column in the data circuit 25. On reading, the output data from the latch belonging to the selected column in the data circuit 25 is provided via the sense amp 33 and the data I/O buffer 31 to external.

A row address signal of the address signal is fed via an address buffer 35 to the row decoder 27. A column address signal of the address signal is fed via the address buffer 35 to the column decoder 29.

A well voltage controller 37 is operative based on an operation mode (such as writing, erasing and reading) to control the voltages on the p- and n-type cell wells 3 and 7 in FIG. 1. In the embodiment the p-type cell well 3 and the n-type cell well 7 are biased at the same voltage. A voltage generator 39 is operative to generate voltages (such as the high voltages Vpgm and Vera) applied, for example, to the cell wells and the word lines.

Figure 11:
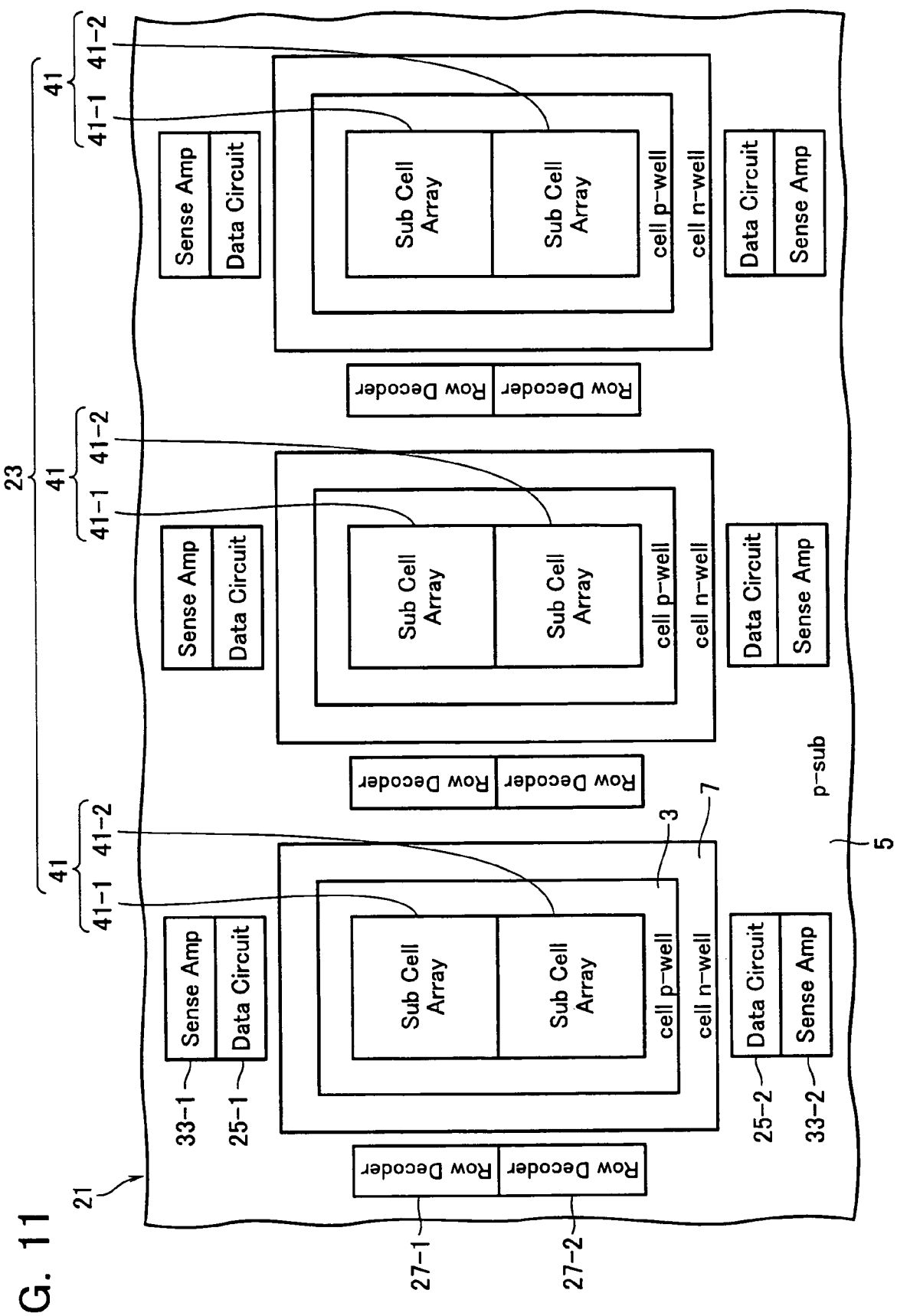
FIG. 11 is a plan view schematically illustrative of part of the NAND-type EEPROM chip according to the embodiment.

FIG. 11 is a plan view schematically illustrative of part of the NAND-type EEPROM chip 21. A plurality of double-wells of the n-type cell well 7 and the p-type cell well 3 are formed in the p-type semiconductor substrate 5, and three double-wells are shown in this figure. The memory cell array 23 of FIG. 10 is a set of cell arrays 41 formed in respective cell wells 3. A cell array 41 is configured to include NAND cells 1 arranged in array. The half of the cell array 41 is a sub cell array 41-1 and the remainder of the cell array 41 is a sub cell array 41-2. One of the sub cell arrays 41-1 and 41-2 is a first sub cell array and the other is a second sub cell array.

The data circuit 25, the sense amp 33 and the row decoder 27 of FIG. 10 are divided and arranged in accordance with respective sub cell arrays. In detail, a data circuit 25-1, a sense amp 33-1 and a row decoder 27-1 are provided corresponding to the sub cell array 41-1, thereby controlling memory cells in the sub cell array 41-1. In addition, a data circuit 25-2, a sense amp 33-2 and a row decoder 27-2 are provided corresponding to the sub cell array 41-2, thereby controlling memory cells in the sub cell array 41-2. A set of the data circuits 25-1 and 25-2 is the data circuit 25. A set of the sense amps 33-1 and 33-2 is the sense amp 33. A set of the row decoders 27-1 and 27-2 is the row decoder 27. One of the sense amps 33-1 and 33-2 is a first sense amp and the other is a second sense amp.

Figure 12:
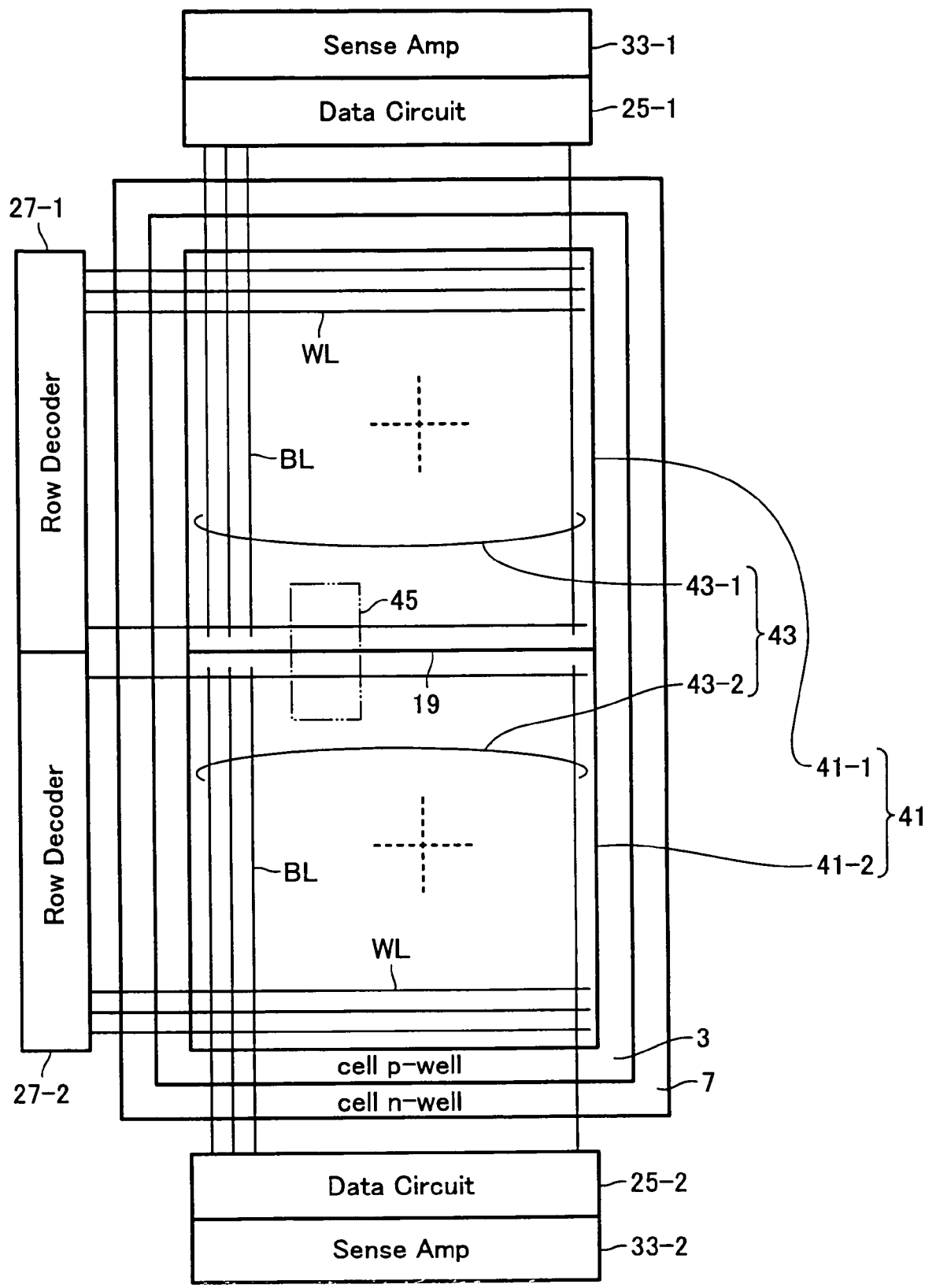
FIG. 12 is a plan view schematically illustrative of a pair of sub cell arrays arranged in a single cell well in the embodiment.

FIG. 12 is a plan view schematically illustrative of the sub cell arrays 41-1 and 41-2 arranged in a single p-type cell well 3. A bit line group 43, or a set of bit lines BL, extends from the sense amp 33-1 to the sense amp 33-2. The bit line group 43 is divided on a boundary 19 between the sub cell arrays 41-1 and 41-2 into a bit line group 43-1 and a bit line group 43-2. The bit line group 43-1 is one of portions of the bit line group 43 divided on the way and corresponds to the sub cell array 41-1. The bit line group 43-2 is the other of portions of the bit line group 43 divided on the way and corresponds to the sub cell array 41-2. One of the bit line groups 43-1 and 43-2 is a first bit line group and the other is a second bit line group.

Figure 13:
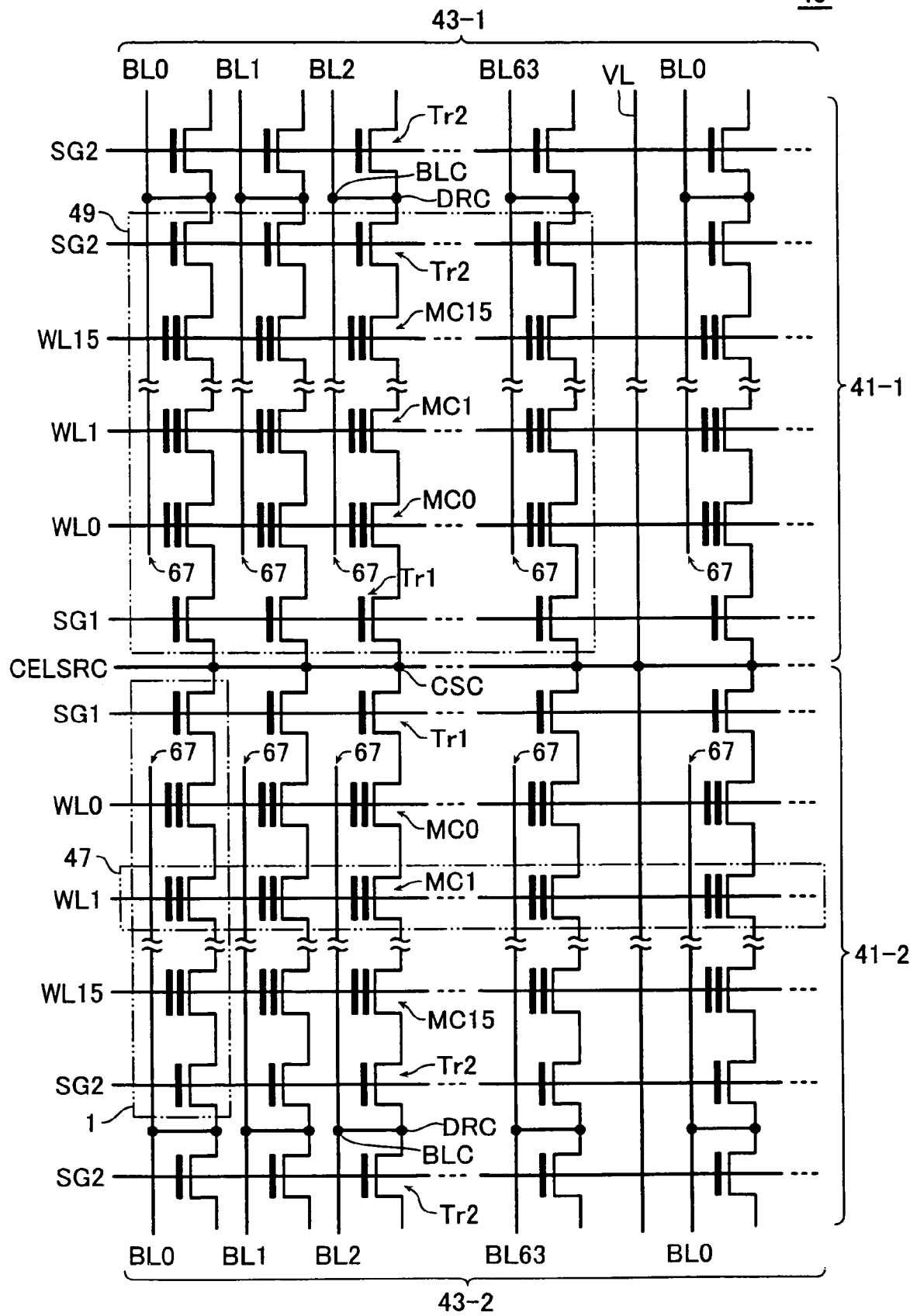
FIG. 13 is an equivalent circuit diagram of a boundary region between the pair of sub cell arrays shown in FIG. 12.

FIG. 13 is an equivalent circuit diagram of a boundary region 45 between the sub cell array 41-1 and the sub cell array 41-2. Along the boundary 19 (FIG. 12) between the sub cell arrays 41-1 and 41-2, groups of NAND cells 1 in the sub cell arrays 41-1 and 41-2 are arranged symmetrically about the source line CELSRC.

In detail, the source line CELSRC extends along the boundary (19 in FIG. 12) between the sub cell arrays 41-1 and 41-2 and corresponds to the boundary. In order of locating away from the source line CELSRC, the selection gate line SG1, the 16 word lines WL0-WL15 and the selection gate line SG2 are arranged. These lines extend in the same direction as the source line CELSRC extends.

Bit lines BL and reference potential lines VL extend in a direction that intersects the source line CELSRC. A reference potential line VL is arranged per 64 bit lines BL0-BL63. The reference potential line VL is connected to the source line CELSRC.

One page 47 is a set of memory cells coupled to one word line WL. One block 49 is configured to include 64 NAND cells 1 arranged in the direction of extension of the source line CELSRC, that is, a direction of alignment of the bit lines BL. The sub cell array 41-1, 41-2 is a set of a plurality (such as 1000) of the blocks 49. As described in the above item of (Erasing), data is erased in batch on the basis of the block 49.

Figure 14:
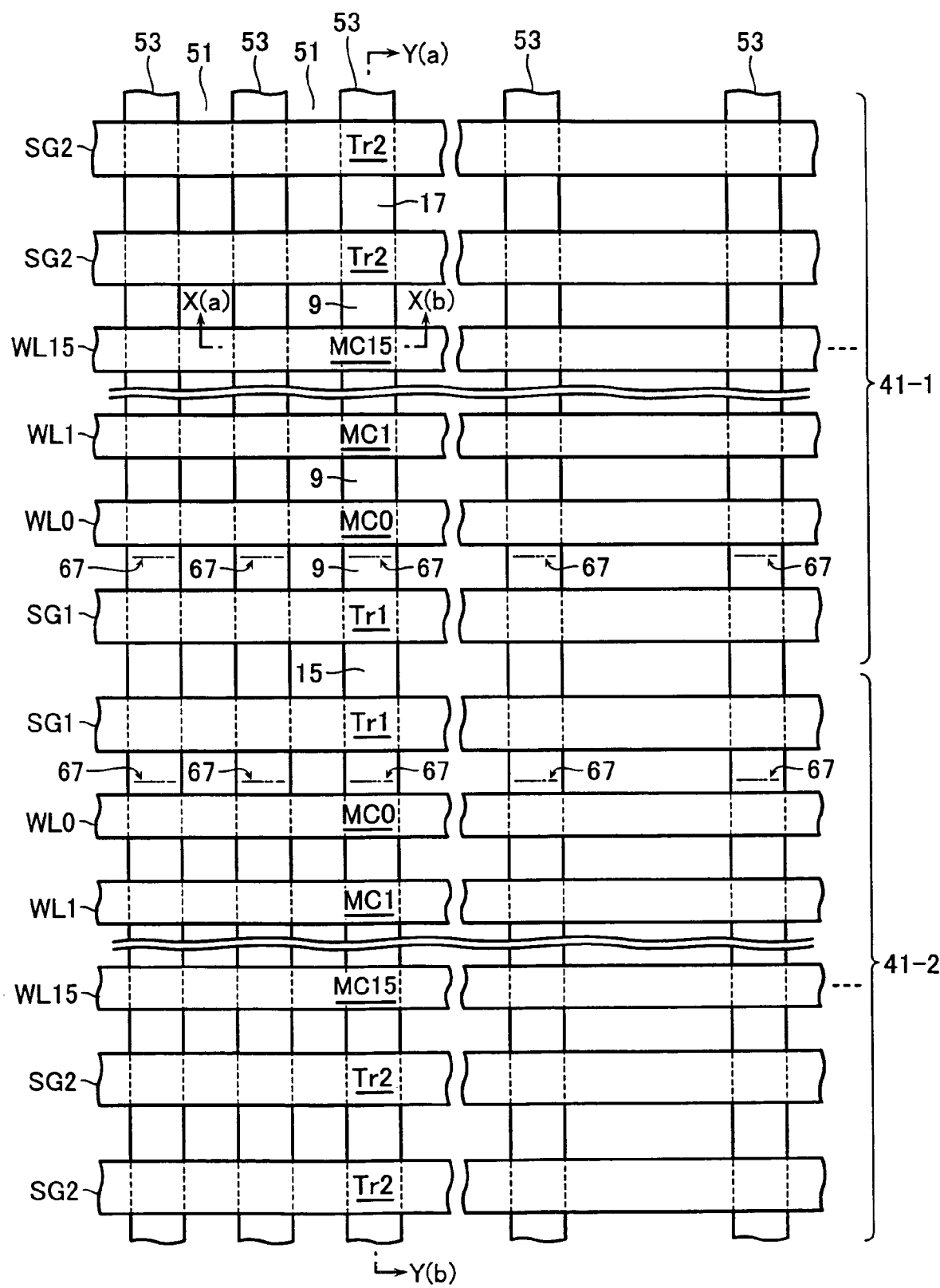
FIG. 14 is a plan view of a bulk layer in the boundary region shown in FIG. 13.
Figure 15:
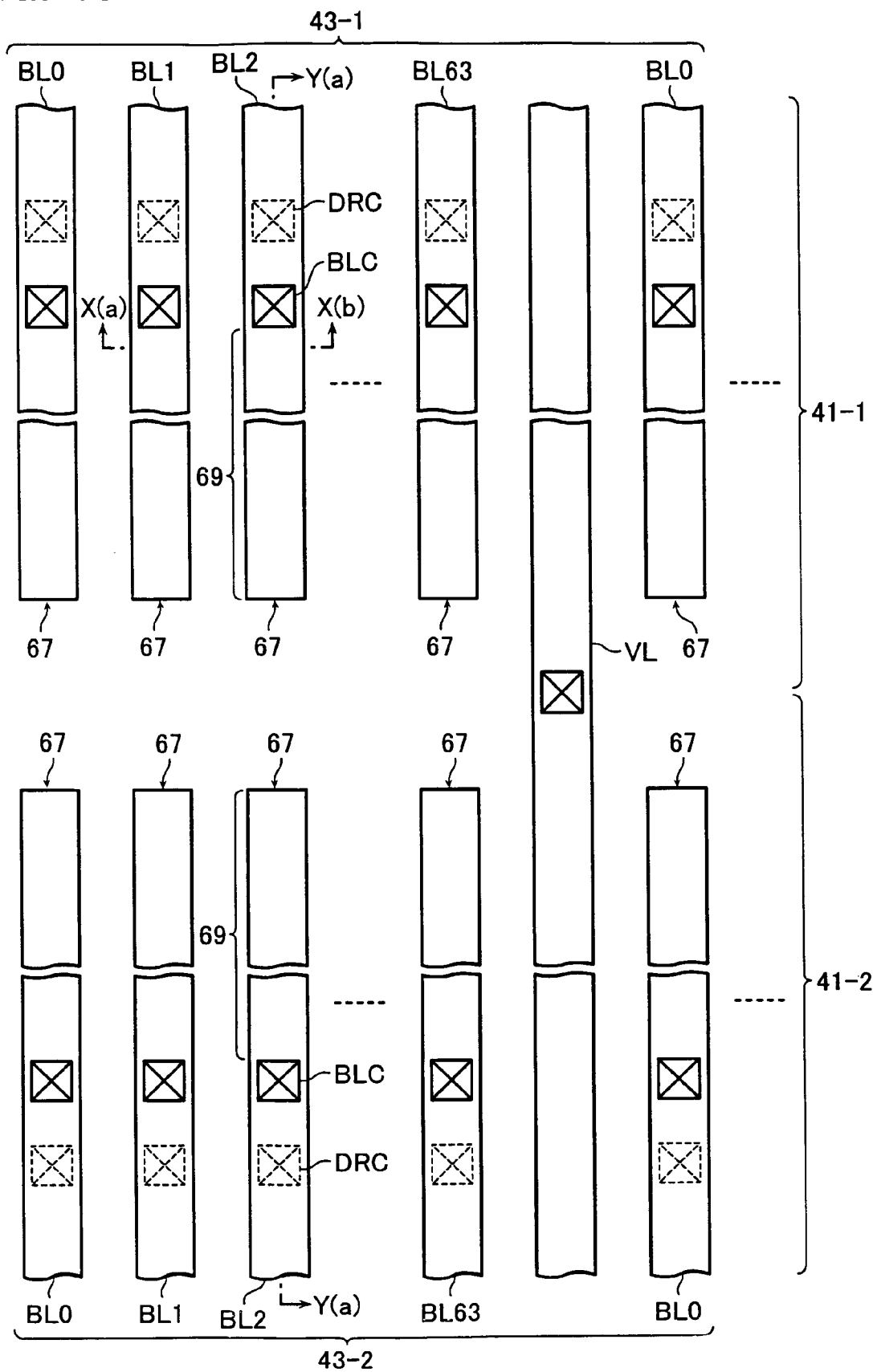
FIG. 15 is a plan view of a bit line layer in the boundary region shown in FIG. 13.
Figure 16:
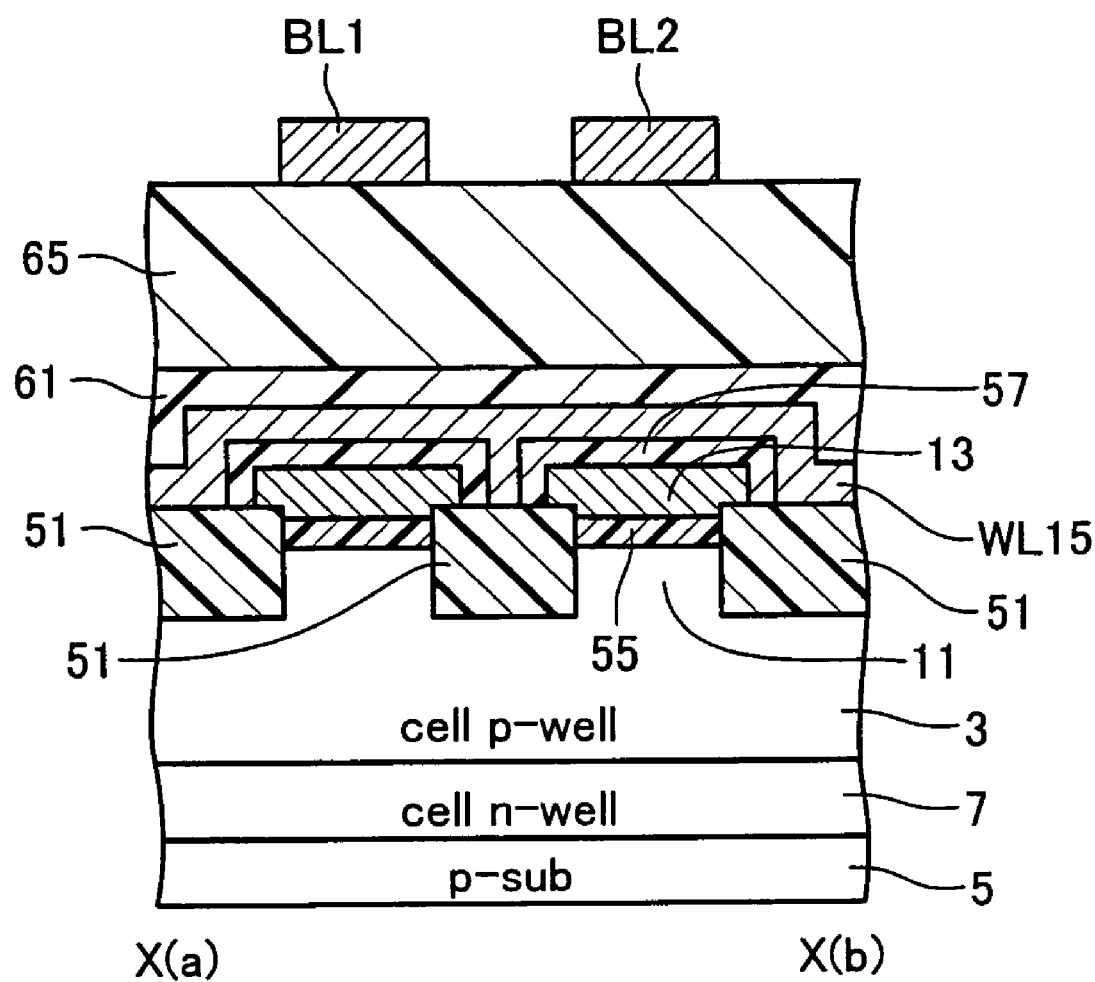
FIG. 16 is a cross-sectional view taken along X(a)-X(b) in FIGS. 14 and 15.
Figure 17:
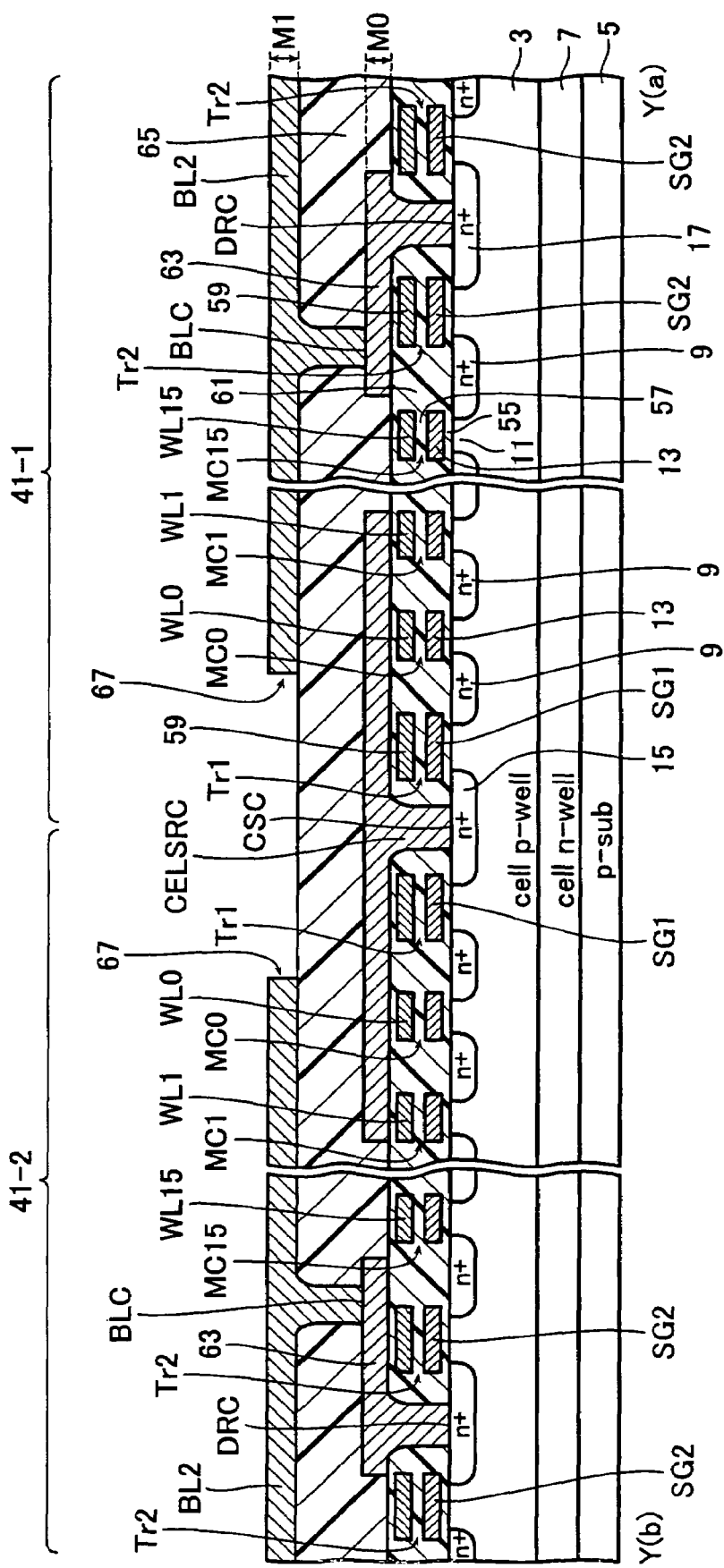
FIG. 17 is a cross-sectional view taken along Y(a)-Y(b) in FIGS. 14 and 15.

FIG. 14 is a plan view of a bulk layer in the boundary region 45 shown in FIG. 13. FIG. 15 is a plan view of a bit line layer in the boundary region 45 shown in FIG. 13. FIG. 16 is a cross-sectional view taken along X(a)-X(b). FIG. 17 is a cross-sectional view taken along Y(a)-Y(b). A sectional structure of the boundary region 45 shown in FIGS. 16 and 17 is described mainly about the parts that are not described in FIG. 1.

Referring mainly to FIG. 14, a device isolation layer 51 having portions extending in the direction of extension of the bit line BL is formed in a semiconductor layer including the p⁻-type semiconductor substrate 5, the n-type cell well 7 and the p-type cell well 3. The device isolation layer 51 can be formed using STI (Shallow Trench Isolation), for example. A region between adjacent portions of the device isolation layer 51 provides an active region 53 for use in formation of a device such as a memory cell. The active region 53 includes the channel region 11 and the $n^+$-type impurity region 9 serving as a source/drain.

Referring mainly to FIGS. 16 and 17, the floating gate 13 is formed on the channel region 11 with a gate insulator 55 interposed therebetween, and the word lines WL0-WL15 are formed on the floating gate 13 with an insulator 57 interposed therebetween. The selection gate lines SG1 and SG2 are formed in the same layer as the floating gate 13 with the gate insulator interposed therebetween. A conductive film 59 is disposed on the selection gate lines SG1 and SG2. The conductive film 59 is located in the same layer as the word lines WL0-WL15. The conductive film 59 may be connected to the selection gate lines SG1 and SG2 or may be floated otherwise.

Referring mainly to FIG. 17, an interlayer insulator 61 is formed covering the memory cells MC0-15 and the selection transistors Tr1, Tr2. A conductive layer M0 is formed on the interlayer insulator 61. The conductive layer M0 includes the source line CELSRC and an intermediate connection layer 63 of the bit line BL. The source line CELSRC is connected to the $n^+$-type impurity region 15 in the selection transistor Tr1. This connection node is a cell-source contact CSC. The portion corresponding to the width of the source line CELSRC expands over the interlayer insulator 61 from the center or the cell-source contact CSC to the word lines WL1 associated with the sub cell arrays 41-1 and 41-2.

The intermediate connection layer 63 is connected to the $n^+$-type impurity region 17 in the selection transistor Tr2. This connection node is a drain contact DRC. The portion corresponding to the width of the intermediate connection layer 63 expands over the interlayer insulator 61 from the $n^+$-type impurity region 9 to the $n^+$-type impurity region 17 in the selection transistor Tr2.

An interlayer insulator 65 is formed covering the conductive layer Mo. A conductive layer M1 is formed on the intermediate connection layer 65. The conductive layer M1 includes the bit lines BL0-BL63 and the reference potential line VL. The bit lines BL0-BL63 are located immediately above the corresponding active regions 53 (FIG. 14). The bit lines BL0-BL63 are connected to the intermediate connection layer 63 above the $n^+$-type impurity region 9 in the selection transistor Tr2. Accordingly, the bit lines BL0-BL63 are connected through the intermediate connection layer 63 to the $n^+$-type impurity region 17 in the selection transistor Tr2. A connection node between the bit line BL0-BL63 and the intermediate connection layer 63 is a bit line contact BLC. The bit-line contact BLC is located closer to the cell-source contact CSC than the drain contact DRC.

Referring mainly to FIGS. 15 and 17, a divided end 67 of each bit line of the bit line group 43-1 is positioned above a location between the word line WL0 and the selection gate line SG1 in the sub cell array 41-1. A divided end 67 of each bit line of the bit line group 43-2 is positioned above a location between the word line WL0 and the selection gate line SG1 in the sub cell array 41-2. Therefore, the bit line group is divided at a location between the bit line contact BLC in the group of NAND cells 1 in the sub cell array 41-1 and the bit line contact BLC in the group of NAND cells 1 in the sub cell array 41-2. The bit line BL0-BL63 has a contact fringe 69 that extends from the bit line contact BLC to the divided end 67.

{Primary Characteristics of the Embodiment}

(First Characteristic)

Figure 18:
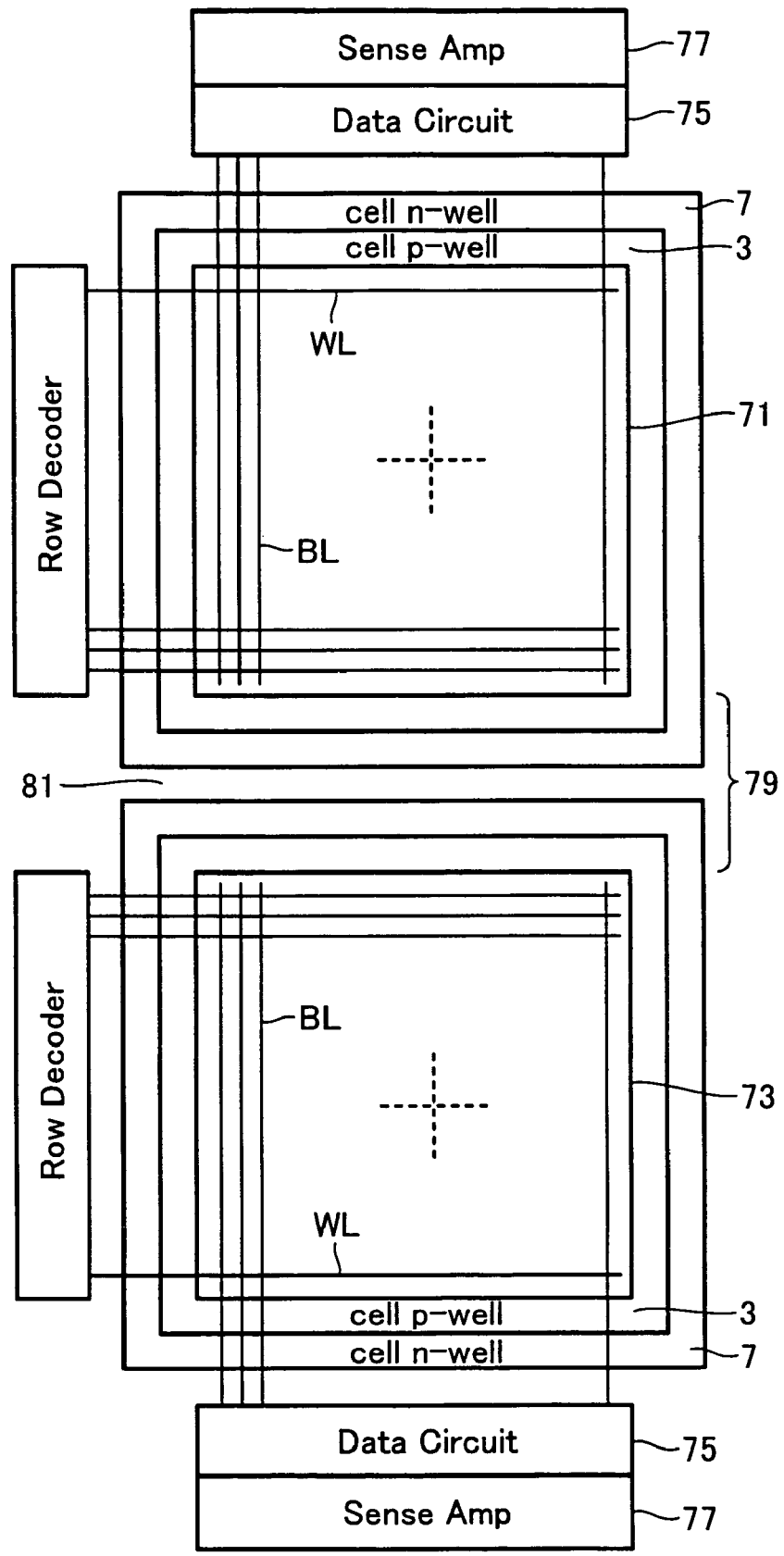
FIG. 18 is a plan view schematically illustrative of two adjacent cell arrays of a plurality of cell arrays contained in a NAND-type EEPROM according to a comparative example.

A first characteristic of the embodiment is described in comparison with a comparative example. FIG. 18 is a plan view schematically illustrative of two adjacent cell arrays 71 and 73 of a plurality of cell arrays contained in a NAND-type EEPROM according to the comparative example.

Like the embodiment, the cell arrays 71 and 73 are formed in separate cell wells 3, respectively. A data circuit 75 and a sense amp 77 for the cell array 71 are formed in an opposite region to a region for use in formation of the adjacent cell array 73. Similarly, a data circuit 75 and a sense amp 77 for the cell array 73 are formed in an opposite region to a region for use in formation of the adjacent cell array 71.

The p-type cell well 3, the n-type cell well 7 in the cell arrays 71, 73 and a device isolation layer 81 to isolate the cell wells 7 are formed in a region 79 between the cell arrays 71, 73. Any circuits such as a sense amp are not formed therein. The region 79 is a dead space because no memory cell can be formed therein.

To the contrary, in the embodiment, a single cell array 41 is divided into the sub cell array 41-1 (an example of the first sub cell array) and the sub cell array 41-2 (an example of the second sub cell array) as shown in FIG. 12. In addition, the bit line group 43 is divided to control these sub cell arrays independently. Thus, it is possible to omit the region 79 shown in FIG. 18 and downsize the NAND-type EEPROM chip 21 shown in FIG. 10 accordingly.

(Second Characteristic)

As can been seen from FIGS. 13 and 17, the source line CELSRC is located on the boundary between the sub cell arrays 41-1 and 41-2. Accordingly, even if no bit lines are present between the bit line contacts BLC of two NAND cells 1 arranged symmetrically about the source line CELSRC, the NAND cells 1 can be controlled. Therefore, the bit line group 43-1 and the bit line group 43-2 may be divided between the bit line contacts BLC regardless of the length of the divided section. The length between the bit line contacts BLC is approximately equal to the length of two NAND cells 1 and has a considerable margin as the dimension of the divided section. Accordingly, patterning of the bit line groups including dividing of the bit line groups can be made easily.

The above considerable margin makes the length of the contact fringe 69 as well as the distance between the divided end 67 of the bit line group 43-1 and the divided end 67 of the bit line group 43-2 larger than a minimal process dimension F. Accordingly, patterning of the bit line groups including dividing of the bit line groups can be made easily also from this point.

(Third Characteristic)

In the embodiment, the sub cell array 41-1 (an example of the first sub cell array) and the sub cell array 41-2 (an example of the second sub cell array) share the cell wells 3 and 7 as shown in FIG. 12. Data writing and reading are executed under the voltages on the cell wells 3 and 7 kept at Vss (ground voltage: 0 V). Accordingly, execution of these operations in one of the sub cell arrays 41-1 and 41-2 exerts no influence on the other. Therefore, data writing and reading can be controlled similarly as before.

Figure 19:
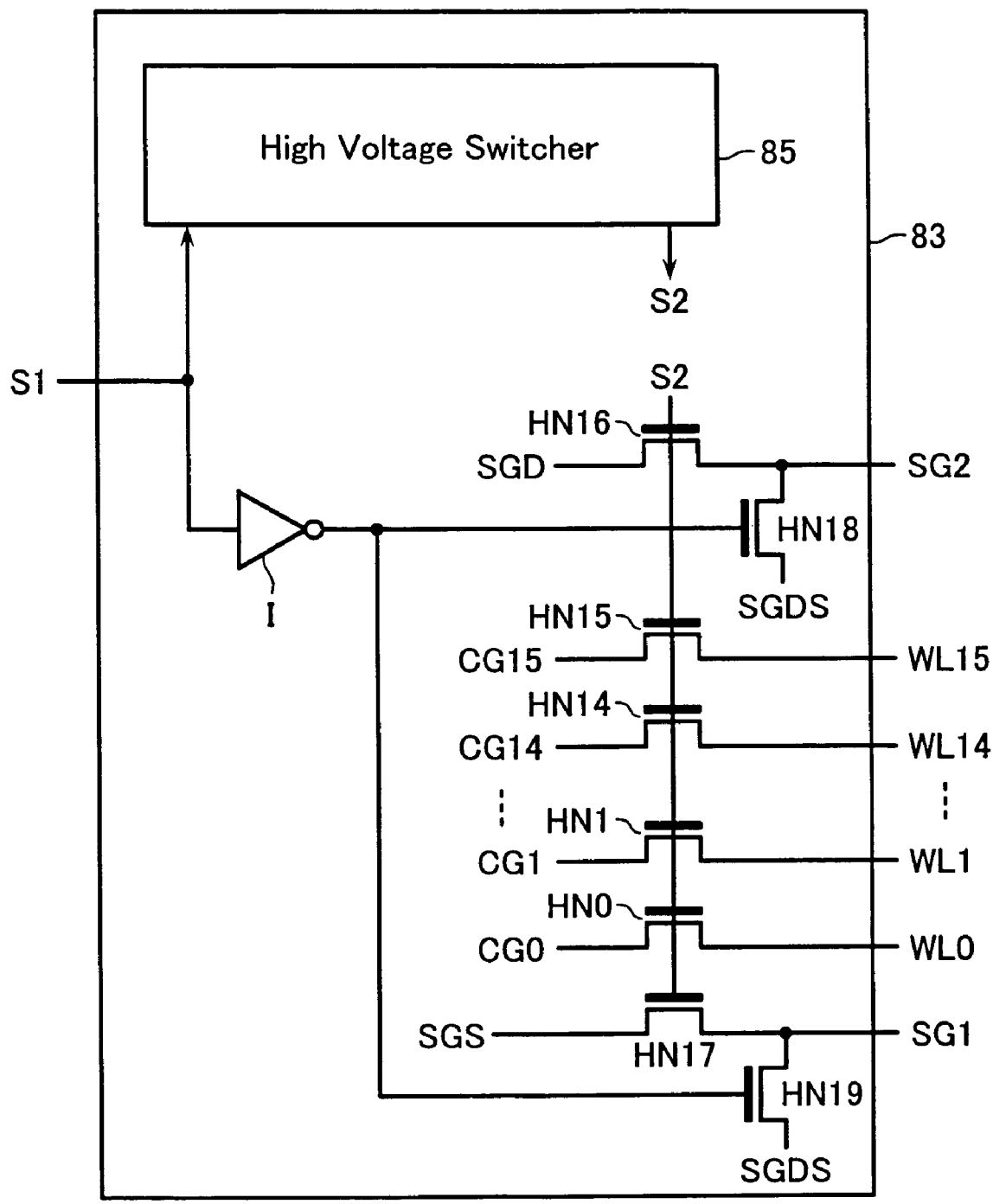
FIG. 19 is a circuit diagram of an example of a word line controller contained in the NAND-type EEPROM according to the embodiment.
Figure 20:
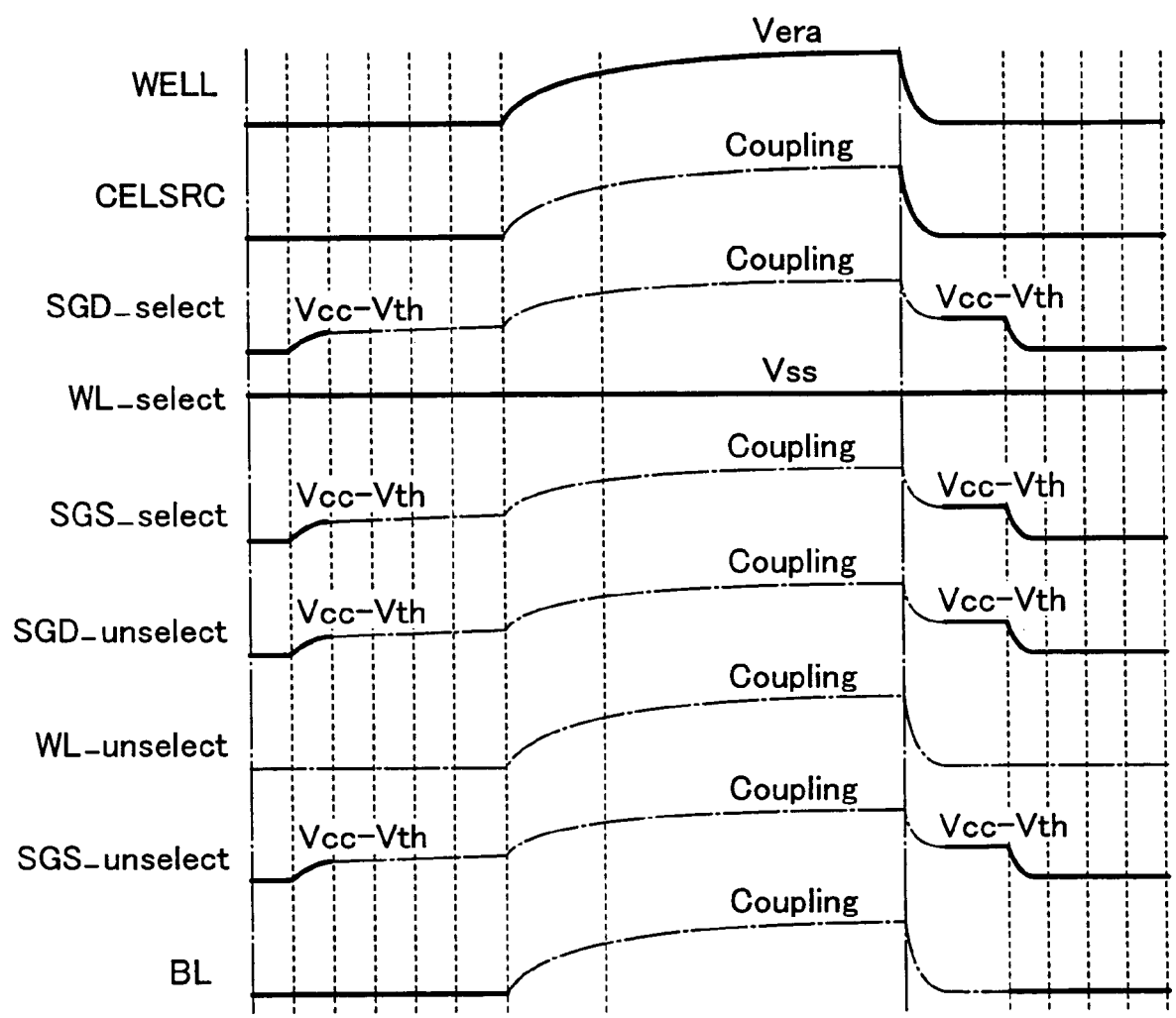
FIG. 20 is a timing chart of erasing in the NAND-type EEPROM according to the embodiment.

To the contrary, on data erasing, high voltages are applied to the cell wells 3 and 7. Accordingly, on erasing in a block in one of the sub cell arrays 41-1 and 41-2, it is required to prevent exertion of any influence on blocks in the other. This will be described after its premise, or batch erasing of data on a block basis, is described first with reference to FIGS. 12, 19 and 20 taking the sub cell array 41-1 as an example. FIG. 19 is a circuit diagram of an example of a word line controller 83. The word line controller 83 is provided in each block. FIG. 20 is a timing chart of erasing.

The sub cell array 41-1 is a set of a number of blocks (the blocks 49 of FIG. 13). On batch erasing of data in a certain block of those blocks, the signal S1 input to the word line controller 83 in the certain block from the row decoder 27-1 is made Vcc ( or "H"). This signal is fed to a high voltage switcher 85, which in turn provides an output signal S2 of Vcc. The signal S2 is employed to turn on MOS transistors HN0-HN17. Voltages on signal lines CG0-15 are set at Vss, and voltages on signal lines SGS and SGD at Vcc, respectively. Turning on of the MOS transistors makes the voltages on the word lines WL0-WL15 at Vss (ground voltage: 0 V). On the other hand, the voltages on the selection gate lines SG1 and SG2 are elevated to Vcc-Vth, which is higher than the ground voltage (Vth denotes the threshold voltage of the MOS transistor HN0, HN15). In addition, the selection gate lines SG1 and SG2 are made floated. Thus, the block aimed for batch erasing is selected.

A high voltage Vera (for example, 20 V) is applied to the p-type cell well 3 and the n-type cell well 7. In this case, the voltages on the word lines WL0-WL15 are kept at Vss in the selected block. Therefore, the potential between the memory cells MC0-MC15 and the cell well 3 has a sufficient value for erasing. Accordingly, in the memory cells MC0-MC15, tunnel current acts to release electrons from inside the floating gate to the cell well 3. As a result, the threshold voltages of these memory cells are shifted negative. Thus, data can be erased in batch from the selected block.

In the selected block, capacitive coupling between the selection gate lines SG1, SG2 and the cell well 3 boosts the voltages on the selection gate lines SG1 and SG2 from Vcc-Vth, thereby holding the selection transistors Tr1 and Tr2 turned off. If the selection gate lines SG1 and SG2 are floated when the voltages on the selection gate lines SG1 and SG2 are at Vss, the above capacitive coupling may not boost the voltages on the selection gate lines SG1 and SG2 sufficiently. In this case, the selection transistors Tr1 and Tr2 may be turned on possibly. Therefore, the selection gate lines SG1 and SG2 are made floated when the voltages on the selection gate lines SG1 and SG2 are at Vcc-Vth.

On the other hand, in the remaining blocks in the sub cell array 41-1 other than the block aimed for erasing, the signal S1 input to the word line controllers 83 in those blocks from the row decoder 27-1 is made Vss (or "L"). This signal is fed to the high voltage switcher 85, which in turn provides the output signal S2 of Vss. The signal S2 is employed to turn off the MOS transistors HN0-HN17. The voltages on the signal lines CG0-15 and signal lines SGS and SGD are set at Vcc, respectively. Therefore, the turning off of the MOS transistors makes the word lines WL0-WL15 floated at a voltage higher than the ground voltage. The turning off of the MOS transistors also allows the signal S1 of Vss to be applied via an inverter I to the gates of the MOS transistors HN18 and HN19 to turn on the MOS transistors HN18 and HN19. In this state, and as SGDC is Vcc, the voltages on the selection gate lines SG1 and SG2 are elevated to Vcc-Vth, which is higher than the ground voltage (Vth denotes the threshold voltage of the MOS transistor HN18, HN19). In addition, the selection gate lines SG1 and SG2 are made floated. Thus, the remaining blocks in the sub cell array 41-1 other the block aimed for batch erasing are not selected.

When the high voltage Vera is applied to the p-type cell well 3 and the n-type cell well 7 in such the non-selected state, capacitive coupling between the word lines WL0-WL15 and the cell well 3 boosts the voltages on the word lines WL0-WL15. Therefore, the potential between the word lines WL0-WL15 and the cell well 3 in the non-selected blocks becomes an insufficient value for erasing. Accordingly, electrons in the floating gate can not move into the cell well 3. Thus, the thresholds of the memory cells MC0-MC15 are not changed but kept unchanged. The operations of the selection gate lines SG1 and SG2 and the selection transistors Tr1 and Tr2 in the non-selected blocks are similar to those in the selected block.

As described above, batch erasing of data on a block basis is performed in the sub cell array 41-1. In the embodiment, the sub cell array 41-2 shares the cell wells 3 and 7 with the sub cell array 41-1. Therefore, when the voltages on the word lines WL0-WL15 in each block in the sub cell array 41-2 are kept at Vss (ground voltage: 0 V), each block in the sub cell array 41-2 is made similar to the selected block in the sub cell array 41-1. Accordingly, data in each block in the sub cell array 41-2 are undesirably erased in batch.

Therefore, all blocks in the sub cell array 41-2 are made non-selected similar to the non-selected blocks in the sub cell array 41-1. This is effective to prevent exertion of any influence on each block in the sub cell array 41-2 during batch erasing of data in a certain block in the sub cell array 41-1.

[Modifications]

{First Modification}

Figure 21:
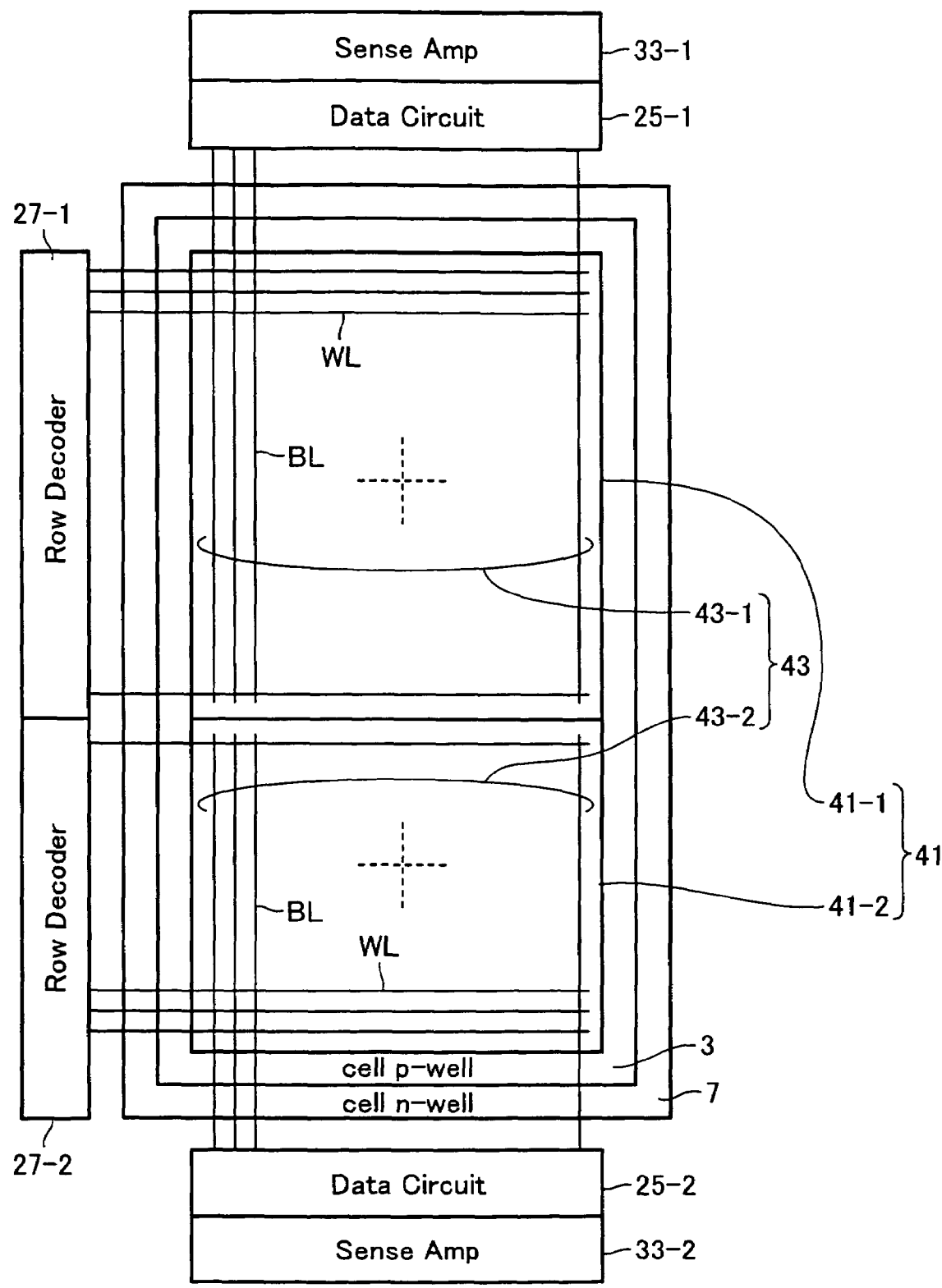
FIG. 21 is a plan view schematically illustrative of a pair of sub cell arrays contained in the NAND-type EEPROM according to a first modification of the embodiment.

FIG. 21 is a plan view schematically illustrative of a pair of sub cell arrays 41-1 and 41-2 according to a first modification of the embodiment and corresponds to FIG. 12. In the first modification, each bit line BL in the bit line group 43-2 (an example of the second bit line group) is designed shorter than each bit line BL in the bit line group 43-1 (an example of the first bit line group). A shorter bit line has a smaller bit line capacitance, which is effective to achieve fast data reading. Therefore, it is possible to employ the sub cell array 41-2 to store image data that is required to read out data at a relatively high speed, and the sub cell array 41-1 to store audio data that is not required to read out data at a relatively high speed.

{Second Modification}

Figure 22:
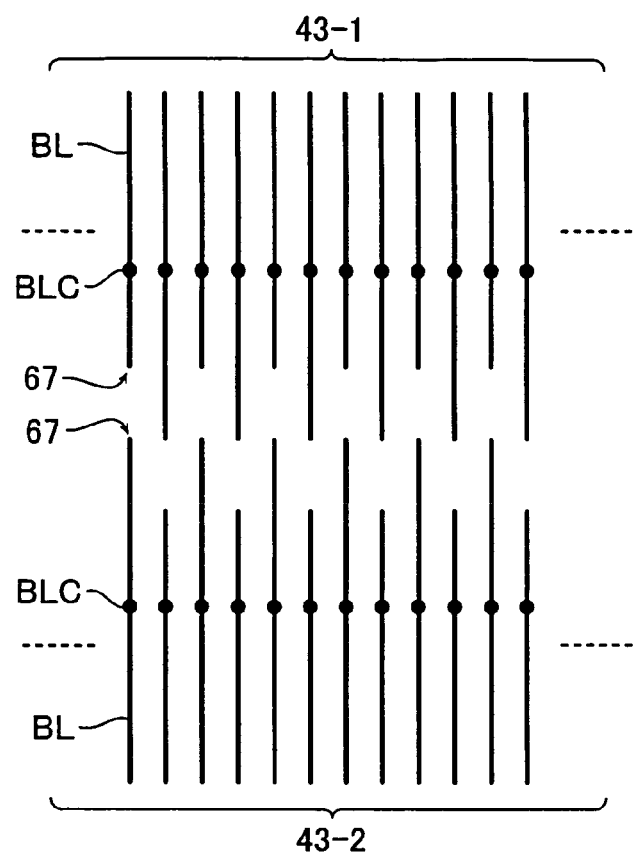
FIG. 22 is a plan view schematically illustrative of an example of a pair of bit line groups contained in the NAND-type EEPROM according to a second modification of the embodiment.

FIG. 22 is a plan view schematically illustrative of a pair of bit line groups 43-1 and 43-2 according to a second modification of the embodiment. In the second modification, the bit lines BL having divided ends 67 located relatively close to the bit line contact BLC and the bit lines BL having divided ends 67 located relatively far from the bit line contact BLC are arranged alternately. Accordingly, the divided ends 67 of the bit lines in the bit line group 43-1 and the divided ends 67 of the bit lines in the bit line group 43-2 are aligned zigzag. In contrast, the divided ends 67 of the bit lines in the bit line group 43-1 and 43-2 are aligned linear in FIG. 13. The zigzag alignment of the divided ends 67 of the bit lines in the bit line group 43-1 and 43-2 makes lithography easier on patterning.

Figure 23:
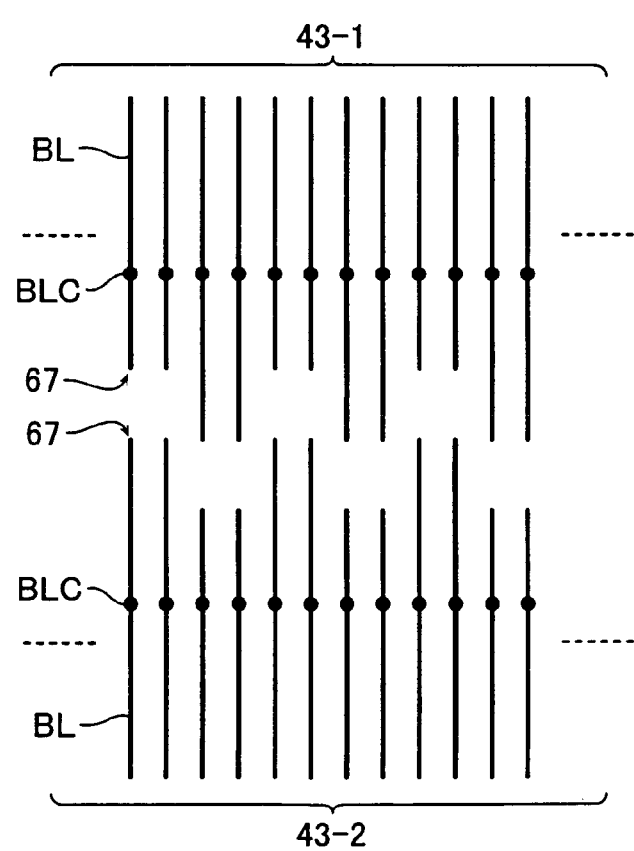
FIG. 23 is a plan view schematically illustrative of another example of a pair of bit line groups contained in the NAND-type EEPROM according to the second modification of the embodiment.

The alignment of the divided ends is not limited to that shown in FIG. 22. For example, as shown in FIG. 23, two of the bit lines BL having divided ends 67 located relatively close to the bit line contact BLC and two of the bit lines BL having divided ends 67 located relatively far from the bit line contact BLC may be arranged alternately.

What is claimed is:

1. A non-volatile semiconductor memory device, comprising:
   a semiconductor substrate;
   a cell well formed in said semiconductor substrate;
   a first sub cell array including part of a cell array of NAND cells arranged in array in said cell well;
   a second sub cell array including the remainder of said cell array and arranged in the same cell well as that for said first sub cell array;
   a first sense amp corresponding to said first sub cell array;
   a second sense amp corresponding to said second sub cell array;
   a first bit line group including one of portions of a bit line group divided on the way extending from said first sense amp to said second sense amp and corresponding to said first sub cell array; and
   a second bit line group including the other of said portions of said bit line group divided on the way and corresponding to said second sub cell array.

2. The non-volatile semiconductor memory device according to claim 1, wherein said second bit line group includes bit lines shorter than those of said first bit line group.

3. The non-volatile semiconductor memory device according to claim 1, wherein said first and second bit line groups have divided ends of bit lines aligned zigzag.

4. The non-volatile semiconductor memory device according to claim 1, wherein groups of said NAND cells in said first and second sub cell arrays are arranged along a boundary between said first and second sub cell arrays and symmetrically about a source line, and
   wherein said bit line group is divided at a location between a bit line contact in said group of said NAND cells in said first sub cell array and a bit line contact in said group of said NAND cells in said second sub cell array.

5. The non-volatile semiconductor memory device according to claim 1, wherein each of said bit lines of said first and second bit line groups has a contact fringe extending from said bit line contact to said divided end, and
   wherein said contact fringe has a length larger than a minimal process dimension, and said divided end of said first bit line group and said divided end of said second bit line group have a distance therebetween larger than said minimal process dimension.

6. The non-volatile semiconductor memory device according to claim 1, wherein said NAND cell includes one selection transistor, a plurality of memory cells, and the other selection transistor all serially connected,
   wherein said first and second sub cell arrays include a plurality of blocks, each including a plurality of said NAND cells arranged in a direction of alignment of bit lines in said bit line group,
   wherein batch erasing of data is performed in said block basis, and
   wherein batch erasing of data in a block in said first sub cell array is performed by selecting said block aimed for batch erasing and not selecting the remaining blocks in said first sub cell array and all blocks in said second sub cell array.

7. The non-volatile semiconductor memory device according to claim 6, wherein said block aimed for batch erasing is controlled to keep voltages on word lines associated with said plurality of memory cells at the ground voltage, keep voltages on selection gate lines associated with said one and the other selection transistors at a voltage higher than the ground voltage, and make said selection gate lines floated so as to select said block aimed for batch erasing,
   wherein the remaining blocks in said first sub cell array and all blocks in said second sub cell array are controlled to make word lines associated with said plurality of memory cells floated, keep voltages on selection gate lines associated with said one and the other selection transistors at a voltage higher than the ground voltage, and make said selection gate lines floated so as not to select the remaining blocks in said first sub cell array and all blocks in said second sub cell array, and
   wherein said cell well is supplied with a certain voltage for batch erasing of data in said selected block.

8. The non-volatile semiconductor memory device according to claim 1, wherein groups of said NAND cells in said first and second sub cell arrays are arranged along a boundary between said first and second sub cell arrays and symmetrically about a source line,
   wherein said bit line group is divided at a location between a bit line contact in said group of said NAND cells in said first sub cell array and a bit line contact in said group of said NAND cells in said second sub cell array, and
   wherein said first and second bit line groups have divided ends of bit lines aligned zigzag.

9. The non-volatile semiconductor memory device according to claim 1, wherein each of said bit lines of said first and second bit line groups has a contact fringe extending from said bit line contact to said divided end,
   wherein said contact fringe has a length larger than a minimal process dimension, and said divided end of said first bit line group and said divided end of said second bit line group have a distance therebetween larger than said minimal process dimension, and
   wherein said first and second bit line groups have divided ends of bit lines aligned zigzag.

10. The non-volatile semiconductor memory device according to claim 1, wherein groups of said NAND cells in said first and second sub cell arrays are arranged along a boundary between said first and second sub cell arrays and symmetrically about a source line,
    wherein said bit line group is divided at a location between a bit line contact in said group of said NAND cells in said first sub cell array and a bit line contact in said group of said NAND cells in said second sub cell array,
    wherein each of said bit lines of said first and second bit line groups has a contact fringe extending from said bit line contact to said divided end, and
    wherein said contact fringe has a length larger than a minimal process dimension, and said divided end of said first bit line group and said divided end of said second bit line group have a distance therebetween larger than said minimal process dimension.

11. The non-volatile semiconductor memory device according to claim 1, wherein groups of said NAND cells in said first and second sub cell arrays are arranged along a boundary between said first and second sub cell arrays and symmetrically about a source line,
    wherein said bit line group is divided at a location between a bit line contact in said group of said NAND cells in said first sub cell array and a bit line contact in said group of said NAND cells in said second sub cell array, wherein each of said bit lines of said first and second bit line groups has a contact fringe extending from said bit line contact to said divided end, wherein said contact fringe has a length larger than a minimal process dimension, and said divided end of said first bit line group and said divided end of said second bit line group have a distance therebetween larger than said minimal process dimension, and wherein said first and second bit line groups have divided ends of bit lines aligned zigzag.

* * * * *